(12) United States Patent
Casset et al.

(10) Patent No.: US 10,954,118 B2
(45) Date of Patent: Mar. 23, 2021

(54) DEVICE WITH A SUSPENDED MEMBRANE HAVING AN INCREASED AMPLITUDE OF DISPLACEMENT

(71) Applicant: COMMISSARIAT A L'ENERGIE ATOMIQUE ET AUX ENERGIES ALTERNATIVES, Paris (FR)

(72) Inventors: Fabrice Casset, Tencin (FR); Pauline Poncet, Gieres (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/335,511

(22) PCT Filed: Sep. 22, 2017

(86) PCT No.: PCT/FR2017/052547
§ 371 (c)(1),
(2) Date: Mar. 21, 2019

(87) PCT Pub. No.: WO2018/055302
PCT Pub. Date: Mar. 29, 2018

(65) Prior Publication Data
US 2020/0017354 A1 Jan. 16, 2020

(30) Foreign Application Priority Data

Sep. 23, 2016 (FR) .................... 16 58959

(51) Int. Cl.
*H02K 33/00* (2006.01)
*H02K 1/12* (2006.01)
(Continued)

(52) U.S. Cl.
CPC .......... *B81B 3/0021* (2013.01); *B81B 3/0024* (2013.01); *H01L 41/094* (2013.01);
(Continued)

(58) Field of Classification Search
CPC ............ H02K 1/12; H02K 33/00; H02K 5/04; H02K 41/035; H01L 41/09
(Continued)

(56) References Cited

U.S. PATENT DOCUMENTS

| 8,440,973 | B1 | 5/2013 | Fernandez et al. |
| 2002/0054060 | A1* | 5/2002 | Schena ................. G05G 9/047 715/701 |

(Continued)

FOREIGN PATENT DOCUMENTS

| EP | 2 416 488 A1 | 2/2012 |
| JP | 2003-262920 A | 9/2003 |
| JP | 2003262920 A * | 9/2003 |

OTHER PUBLICATIONS

Machine Translation JP2003262920 (Year: 2003).*
(Continued)

*Primary Examiner* — Jose A Gonzalez Quinones
(74) *Attorney, Agent, or Firm* — Oblon, McClelland, Maier & Neustadt, L.L.P.

(57) ABSTRACT

A device with a membrane comprising a support, a membrane made of a polymer material suspended on said support and at least one actuating module arranged opposite a face of the membrane and separate from said membrane, said actuating module comprising at least one actuator comprising at least one piezoelectric material and a beam connected to the support and separate from the membrane, the piezoelectric material being connected to the beam, such that, when a difference in electric potential is applied to the piezoelectric material, a bimetal effect appears between the piezoelectric material and the beam deforming the beam in the direction of the membrane, causing the deformation of the membrane, said device also comprising at least one electrostatic actuator configured for compressing at least one
(Continued)

part of the membrane on the at least one part of the actuating module.

17 Claims, 8 Drawing Sheets

(51) Int. Cl.
 H02K 5/04 (2006.01)
 H02K 41/035 (2006.01)
 H01L 41/09 (2006.01)
 H01L 41/29 (2013.01)
 B81B 3/00 (2006.01)
 H01L 41/31 (2013.01)
 H01L 41/332 (2013.01)
 H01L 41/187 (2006.01)

(52) U.S. Cl.
 CPC .............. *H01L 41/29* (2013.01); *H01L 41/31* (2013.01); *H01L 41/332* (2013.01); *H02K 1/12* (2013.01); *H02K 5/04* (2013.01); *H02K 33/00* (2013.01); *B81B 2201/032* (2013.01); *B81B 2203/0118* (2013.01); *B81B 2203/0127* (2013.01); *B81B 2203/04* (2013.01); *H01L 41/1876* (2013.01); *H02K 41/035* (2013.01)

(58) Field of Classification Search
 USPC ..................................... 310/309, 311, 323.06
 See application file for complete search history.

(56) References Cited

U.S. PATENT DOCUMENTS

| | | | |
|---|---|---|---|
| 2002/0109436 A1 | 8/2002 | Peng et al. | |
| 2010/0090565 A1* | 4/2010 | Bhaskaran | B81B 3/0021 310/330 |
| 2011/0013300 A1* | 1/2011 | Wu | G02B 26/0825 359/849 |
| 2012/0018680 A1 | 1/2012 | Nakagawa et al. | |
| 2013/0082569 A1* | 4/2013 | Hirabayashi | H02N 2/181 310/319 |
| 2013/0128368 A1* | 5/2013 | Costache | G02B 26/004 359/666 |
| 2013/0294636 A1* | 11/2013 | Cassett | H04R 1/005 381/386 |
| 2016/0219375 A1* | 7/2016 | Hall | H04R 17/02 |

OTHER PUBLICATIONS

International Search Report dated Jan. 5, 2018 in PCT/FR2017/052547 filed on Sep. 22, 2017.
French Preliminary Search Report dated May 19, 2017 in French Application 16 58959 filed on Sep. 23, 2016.
Poncet, P. et al., "Design and realization of electroactive polymer actuators for transparent and flexible haptic feedback interfaces", Int. Conf. on Thermal, mechanical and multi-physics simulation and experiments in microelectronics and microsystems (Eurosime), 2016, 5 pages.
Casset, F. et al., "Zipping Variable Capacitor Development", Mechatronics, 2004, pp. 1-5.

* cited by examiner

DEVICE WITH A SUSPENDED MEMBRANE HAVING AN INCREASED AMPLITUDE OF DISPLACEMENT

TECHNICAL FIELD AND PRIOR ART

The present invention relates to a device with a suspended membrane having an increased amplitude of displacement.

The devices with a suspended membrane in particular in the field of microelectronics have numerous uses.

One of its uses is the creation of labs-on-chips for the treatment of biological cells, in particular in order to carry out intracellular delivery. For this the cells adhere to the surface of a membrane, the latter is deformed by the implementation of one or more actuators, which causes the deformation of the envelope of the cell and the appearance of reversible membrane holes that allow the delivery of substances to the cell.

In order to be effective, the amplitude of the deformation applied to the cells to make membrane holes appear must be relatively large, which requires actuators capable of generating significant displacements.

Another use of these devices with a suspended membrane is the creation of haptic interfaces, for example haptic buttons. A user passes the user's finger over the membrane, the membrane is thus deformed according to a given haptic pattern in order to transmit a piece of information to the user. However, in order to have good haptic feel, it is sought to have a significant amplitude of deformation of the membrane.

Moreover in order to have significant displacements, for example of approximately several µm, it is desirable to implement membranes made of polymer material that offer a significant amplitude for the deformation.

However, the piezoelectric materials implemented in a piezoelectric actuator that can be deposited on a polymer membrane have low piezoelectric coefficients. The dielectric coefficient links the proportionality between the electric charges and the stress. Materials with a low dielectric coefficient do not allow the creation of actuators generating large displacements as is described in the document P. Poncet, F. Cosset, A. Latour, F. Domingues Dos Santos, S. Pawlak, R. Gwoziecki, S. Fanget, "Design and realization of electroactive polymer actuators for transparent and flexible haptic feedback interfaces", Int. Conf. on Thermal, mechanical and multi-physics simulation and experiments in microelectronics and microsystems (Eurosime), 2016.

Indeed, the methods for creating actuators implementing non-organic materials having strong piezoelectric coefficients such as Lead Zirconate Titanate (PZT) or AlN allowing to generate large displacements require temperatures incompatible with the use of a membrane made of polymer material, for example a temperature of approximately 700° C. is required for PZT and of 300° C. for AlN.

In the case of a system implementing one or more thermal actuators, the actuator comprises a material secured to the membrane, when the actuator is heated, the thermal expansion differential between the material and the polymer of the membrane causes a curvature of the membrane. However, the thermal expansion differential is too small to form an effective actuator capable of significantly deforming the membrane.

Finally, it is additionally sought to create devices in which the membrane offers a certain rigidity, for example in order to apply an effective stress to the biological cells or to offer sufficient feel to the user in the case of a haptic interface.

However, a polymer membrane suspended from a support does not generally offer sufficient rigidity.

DISCLOSURE OF THE INVENTION

The goal of the present invention is thus to offer a device with a polymer membrane offering an increased amplitude of displacement.

The goal of the present invention is achieved by a device comprising a membrane made of polymer material suspended from a support, at least one actuation module with a bimetallic-strip effect capable of applying a deformation stress to the membrane when it is activated, the module with a bimetallic-strip effect being distinct from the membrane.

Via the invention, one or more actuators with a bimetallic-strip effect, in particular piezoelectric actuators using a material having a high piezoelectric coefficient can be used, since during the manufacturing of the device, they can be created separately from the membrane, no element of the actuators is made on the membrane. The problem related to the temperature is no longer applicable or less applicable.

In other words, the bimetallic-strip effect appears between an element, different than the membrane, that is secured to the structure and a material capable of being deformed under the effect of an outside stimulus and not between such a material and the membrane. Thus, an actuation module can be created in which the material does not have to be deposited on the membrane.

The actuation module further ensures a function of at least partial rigidification of the contact surface.

The outside stimulus is for example a difference in electric potentials in the case of piezoelectric actuators or a supply of heat in the case of thermal actuators.

Preferably, the actuation module comprises at least one beam of the cantilever type.

Preferably, the actuation module comprises at least two actuators with a bimetallic-strip effect, one of the actuators being capable of ensuring a significant deformation of the membrane and the other actuator more finely deforming the membrane, which allows to better control the deflection shape of the membrane. This example of realisation allows to create a membrane offering good rigidity.

Very advantageously, the device also comprises an electrostatic actuator ensuring the pressing of the membrane against the actuation module, which thus offers additional rigidity to the membrane. The electrostatic actuator is formed partly on the membrane and partly on the actuation module.

It can also be intended to vibrate the membrane, advantageously by using the actuators used to deform the membrane.

The subject-matter of the present invention is therefore a device with a membrane comprising a support, a membrane at least partly made of a polymer material, suspended from said support and at least one actuation module disposed facing a face of the membrane and distinct from said membrane, said actuation module comprising at least one first actuator comprising at least one first material capable of expanding and/or contracting under the effect of an outside stimulus secured to an element anchored to the support and distinct from the membrane, in such a way that, when an outside stimulus is applied to the first material, a bimetallic-strip effect appears between the first material and the element, deforming the element in the direction of the membrane and causing the deformation of the membrane.

The device can comprise a plurality of elements anchored to the support.

In an example of realisation, the element(s) comprise a cantilever beam.

For example, the cantilever beams are disposed radially and each beam comprises a free end, the free ends of the beams being located at a central portion of the membrane.

In an advantageous example, the actuation module further comprises, at least a second actuator comprising a second material capable of expanding and/or contracting under the effect of an outside stimulus, said second actuator being secured to said element.

Preferably, said second material is disposed with respect to the first material in such a way as to be capable of applying, to said element, a deformation having a curvature opposite to that applied by the first material.

The device with a membrane can comprise at least one electrostatic actuator capable of pressing at least a portion of the membrane against at least a portion of the actuator module. The electrostatic actuator can comprise at least one electrode carried by the membrane and at least one electrode secured to said element. The electrode secured to the element is advantageously at least one of the electrodes of the first and/or of the second actuator.

The first and/or the second material can be a piezoelectric or ferroelectric material, the first and/or the second actuator can comprise electrodes for applying a difference in electric potential to the first material and/or to the second material.

The first material and/or the second material are advantageously chosen from AlN, PZT, ZNO, LNO.

In an example of realisation, the first actuator and/or the second actuator are thermal actuators.

According to an additional feature, the device with a membrane can comprise means for vibrating the membrane. The means for vibrating the membrane advantageously comprise the first and/or the second actuator.

In an advantageous example, the polymer material of the membrane is a transparent polymer.

The subject-matter of the present invention is also a device for treatment of biological cells comprising at least one device with a membrane according to the invention.

The subject-matter of the present invention is also a haptic interface comprising at least one device with a membrane according to the invention.

Another subject-matter of the present invention is also a method for creating a device with a membrane according to the invention, comprising the steps:
creation of an actuation module,
creation of a membrane at least partly made of a polymer material,
assembly of the actuation module and of the membrane in such a way that the activation of the actuation module deforms the membrane.

BRIEF DESCRIPTION OF THE DRAWINGS

The present invention will be better understood on the basis of the following description and the appended drawing in which.

DETAILED DISCLOSURE OF SPECIFIC EMBODIMENTS

Figure 1:
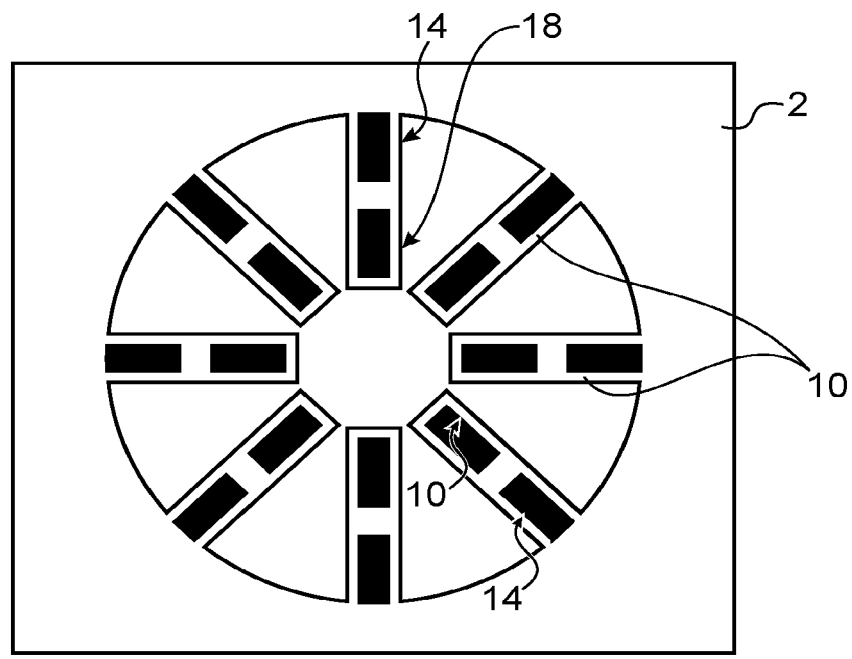
FIG. 1 is a top view of an example of realisation of a device with a membrane according to the invention, the membrane being omitted.
Figure 2:
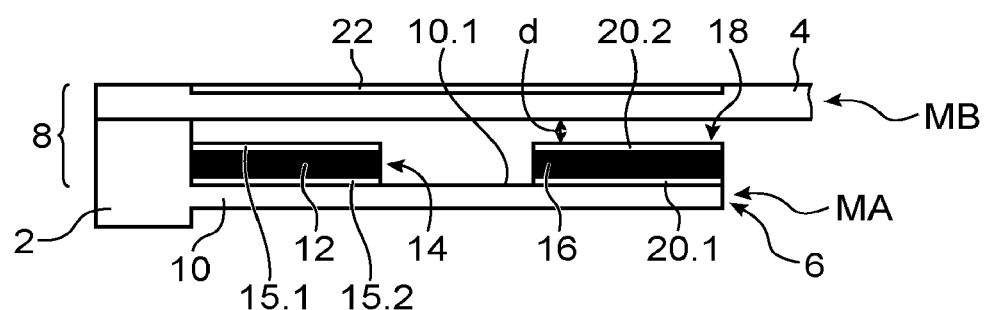
FIG. 2 is a partial cross-sectional view of the device of FIG. 1.

In FIGS. 1 and 2, an example of realisation of a device with a membrane according to the invention can be seen.

The device comprises an actuation module designated as MA and a module MB comprising a membrane 4; the modules MA and MB are made separately and assembled afterwards.

The device comprises a membrane 4 made of a polymer material, a support 2 on which the membrane 4 is suspended, means 6 for deforming the membrane 4 and advantageously means 8 for pressing the membrane against the means 6. The module MA comprises the means 6 for deforming the membrane 4 and a portion of the means 8 for pressing the membrane against the means 6. The membrane is disposed on the module MA in such a way as to be deformed when the means 6 are activated.

In the example shown the membrane 4 is circular but a membrane of any other shape, for example oval or rectangular, or even a beam of the cantilever type or embedded at its tow end does not go beyond the context of the present invention.

The membrane 4 is made at least partly from a polymer material offering an aptitude to be elastically deformed with a significant amplitude. The aptitude to be deformed manifests itself as a low Young's modulus, of approximately several GPa, typically from 2 GPa to 6 GPa. For comparison, silicon has a Young's modulus of approximately 160 GPa.

The membrane is for example made of poly(ethylene naphthalate) (PEN) or PolyCarbonate (PC) and can comprise one or more layers of polymer. Its thickness is for example between several p.m and several hundred μm.

The membrane could also comprise, on or under the polymer material, non-polymer materials allowing for example a functionalisation of the membrane, for example materials of protections to UV and/or scratches and/or to cosmetic products.

Very advantageously, the polymer is transparent or partly transparent which allows for example in the case of a device for treatment of biological cells to characterise the cells by transparency. In the case of a haptic interface, the implementation of a transparent membrane can allow to implement visual means under the membrane that could be activated according to the action of the finger on the membrane and be seen by the user. For example, these could be a pictogram corresponding to the action of the haptic button that will be touched.

The means for deforming the membrane comprise at least one beam 10 secured to the support and at least one first material 12 capable of being deformed under the effect of an outside stimulus in such a way as to generate a bimetallic-strip effect deforming the beam and applying an out-of-plane deformation to it. The beam and the first material form a first actuator 14 with a bimetallic-strip effect.

In the example shown and advantageously, a plurality of beams 10 are implemented. The beams are advantageously of the cantilever type. Moreover advantageously, the beams are radially and regularly distributed under the membrane 4 in such a way as to be able to apply a uniform deformation to it.

The first material is advantageously a piezoelectric material, for example AlN, LNO or ZnO having a significant piezoelectric coefficient. In this case the stimulus is a difference in electric potential. Electrodes 15.1 and 15.2 are disposed on either sides of the piezoelectric material 12. By applying a difference in potential between the electrodes 15.1 and 15.2, the material 12 changes in dimension which, because of the coupling with the beam 10, causes a curvature of the beam. The arrangement of the actuator allows to orient the curvature of the beam.

According to whether the difference in potential applied to the electrodes 15.1, 15.2 is positive or negative, the material will expand or contract.

As a variant, the first actuator could comprise a material deforming under the effect of heat, the material having an expansion coefficient very different from that of the beam, in such a way as to have a significant thermal expansion differential between the beam and the material and thus offer a significant deformation. The stimulus is then a supply of heat.

In the example shown, the first material 12 is disposed at the embedded end of the beam 10 and on a face 10.1 of the beam 10 facing the membrane.

Very advantageously, the deformation means 6 comprise a second actuator 18 with a bimetallic-strip effect allowing to control the deflection shape of the beam and thus that of the membrane.

The second actuator 18 comprises a second material 16 capable of being deformed under the action of an outside stimulus and disposed near the free end of the beam 10. Like for the first material 12, the second material 16 is advantageously a piezoelectric material, but it could be a material sensitive to heat. Moreover, the first and second actuators could be of different types.

The second actuator 18 also comprises two electrodes 20.1, 20.2 on either side of the piezoelectric material 16.

In the example shown, the two actuators 14 and 18 are disposed on a face of the beam 10 facing a face of the membrane 4. It is possible for the actuators to be disposed on the other face of the beam or for the two actuators to be each disposed on a different face of the beam. The sign of the potential differences applied to each of the actuators is thus chosen according to the location of the actuators.

It could be possible to replace the piezoelectric materials with ferroelectric materials such as PZT, these materials have the property either of contracting or of expanding under the effect of a difference in potential regardless of the sign of the difference in electric potential. It is thus provided to dispose a first material on a face of the beam in a first zone and a second material on the opposite face of the beam in a second zone, the activation of the first and second actuator causing deformations of the first zone and of the second zone according to opposite curvatures.

Moreover, advantageously, the means 8 for pressing the membrane 4 against the actuation module MA comprise an electrostatic actuator capable of ensuring the pressing of the membrane 4 against the actuation module MA.

For this, the membrane comprises at least one electrode 22 on its face 4.2 opposite to that 4.1 against which the beam is intended to act. In the example shown and very advantageously, the electrostatic actuator uses the electrodes 15.1 and 20.1 of the first 14 and second 18 actuators. Advantageously, the electrode 22 extends in such a way that its projection onto the beam 10 covers the electrodes 15.1 and 20.1. Thus, the electrode 20 forms, with the electrode 15.1 of the first actuator 14 with a bimetallic-strip effect, an electrostatic actuator and forms, with the electrode 20.1 of the second actuator with a bimetallic-strip effect 18, a second electrostatic actuator. The application of a difference in potentials between the electrodes 22 and 15.1 and between the electrodes 22 and 20.1 has the effect of generating electrostatic forces that press the membrane against the electrodes 15.1 and 20.1.

As a variant, the electrode 22 could extend in such a way as to only form an electrostatic actuator with one of the electrodes 15.1 and 20.1 or with only a portion of one and the other of the electrodes 15.1, 20.1.

Also as a variant, one or more electrodes 20 secured to the beam that are distinct from those of the actuators 14 and 18 could be possible.

In the example shown, the means for deformation of the membrane 4 are separated by a certain distance d from the face 4.1 of the membrane in the rest state.

Preferably, the distance d is controlled in order to be able to precisely control the deformation of the membrane.

As a variant, the deformation means 6 could be permanently in contact with the face 4.1 of the membrane.

It is possible for the beam 10 to carry more than two actuators with a bimetallic-strip effect, which allows to control the shape of the beam even more. For example, it could be intended to implement a plurality of actuators successively, by adjusting the voltages and the signs of the voltages in order to impose the desired shape onto the membrane.

The operation of the device will now be described using FIGS. 4A and 4B. Only one beam is shown.

Figure 4A:
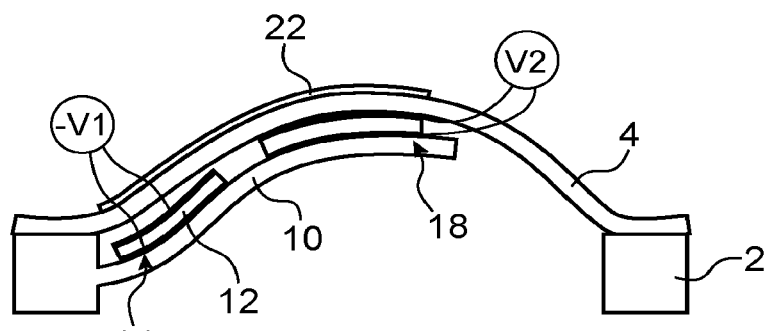
FIGS. 4A and 4B are cross-sectional views of the device of FIG. 2 in two states of actuation.

A difference in potential −V1 is applied between the electrodes 15.1 and 15.2 of the first actuator 14, the first material 12 contracts which makes a bimetallic-strip effect appear between the first material and the beam 10 which curves in the direction of the membrane 4, and deforms the latter (FIG. 4A).

A difference in potential +V2 having a sign opposite to that applied to the electrodes 15.1, 15.2, is applied between the electrodes 20.1 and 20.1 of the actuator 18, the material 16 expands, a bimetallic-strip effect appears between the material 16 and the beam 10, the zone of the beam carrying the material 16 curves according to a curvature opposite to that caused by the first actuator 14.

Figure 4B:
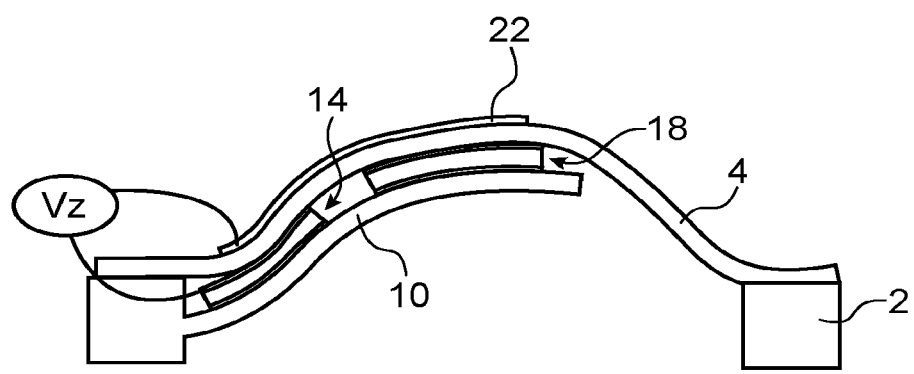

The membrane 4 is thus advantageously deformed according to a bulging profile (FIG. 4B). The membrane 4 thus has an increased deflection.

It is understood that the first 14 and second 18 actuator could be activated simultaneously.

The second actuator 18 advantageously allows to better control the deflection shape of the membrane, and thus to better control the stress applied for example to a biological cell in order to transfect it.

During a following step, a difference in potential designated as Vz is applied between the electrodes 15.1 and 20.1 and the electrode 22 carried by the membrane 4, forming a counter-electrode. Under the action of this difference in potential, an electrostatic force appears between the membrane 4 and the beam 10. This force is even stronger when the air gap is smaller. The membrane comes in contact with the beam 10 at the electrodes, this results in a phenomenon of pressing of the membrane 4 against the beam 10, this phenomenon is called "zipping" and was described in the document Cosset et al. "*Zipping variable capacitor development*", *Mechatronics* 2004.

The pressing of the membrane 4 against the beam 10 has the effect of rigidifying the membrane 4. The application of a stress onto a cell is thus better controlled. In the case of a haptic interface, the sensation felt by the user is improved.

In the particular case of the treatment of biological cells, the membrane is part of a treatment device and forms a treatment support onto which cells to be treated adhere. The operation of a treatment device according to the invention will now be described.

The case of a single cell will be described, but it is understood that in general a plurality of cells can be treated simultaneously by the same device according to the size of the treatment support.

During a first step, the cell that is desired to be treated, i.e. to which a cellular delivery is to be applied, is introduced into the device The cell is in general in suspension in a liquid medium. For example, a pipette that can dispense a desired volume of liquid and the desired quantity of cell is used. Alternatively, a microfluidic circuit can be connected to the device.

During a second step, the cell adheres to the treatment support. For this a phase of sedimentation takes place during which the cell is deposited via gravity on the treatment support. The cell then attaches to the membrane and adheres. The duration of this step can be approximately several tens of minutes. The longer this step, the greater the intensity of the force of adhesion. The control of the duration of this step thus allows to control the force of adhesion of the cell onto the membrane.

Advantageously, the surface of the treatment support can comprise zones facilitating the adhesion of the cells or on the contrary making it more difficult. In this case the cell adheres in a zone in which the adhesion is promoted or at least not degraded.

As a variant, it is possible to use one or more stencils above the surface of the support, the stencil or stencils being made from a material that does not promote cell adhesion and comprise(s) orifices at the location in which it is desired for the cells to be deposited. The stencil or stencils is or are then removed at the end of the sedimentation step.

During a following step, the medium containing the elements to be introduced into the cell is injected into the device. This medium is for example a culture medium containing the macromolecules to be introduced into the cell. This medium can be injected via a pipette or via a fluidic circuit, which can be the same as that transporting the medium containing the cells. Advantageously, the medium containing the elements to be introduced into the cell is injected into the treatment device before the opening of the pores.

During a following step, a deformation is applied to the cell. For this the actuator or the actuators are activated by applying a direct difference in potential to the terminals of the electrodes of the actuator or the actuators. The actuator or the actuators cause the desired deformation of the support, applying a deformation to the cell which has adhered onto the support. This deformation causes the appearance of at least one transitory pore. The duration of application of the stress to the cell is approximately several seconds.

The choice of the difference in potential to be applied to the actuator or to the actuators is made by the operator via for example charts giving the deflection of the treatment support according to the difference in potential applied in order to create one or more transitory pores in given types of cells which will have been created during the manufacturing of the device.

During a following step, the actuator(s) are deactivated by cancelling the direct voltage applied to the electrodes of the actuator, the treatment support returns to its rest position and bringing the adherent cell back to a non-stressed state, the membrane of the cell comprises at least one pore.

As long as the pore(s) are open, the elements to be introduced contained in the liquid medium penetrate into the cells via the pore(s).

During a following step, no stress is applied to the cell in order to allow the closing of the pore(s). This step can last several minutes.

At the end of the step of closing of the pores, the treated cell is recovered. The cell can undergo a plurality of treatments in order for different types of elements to be delivered to it.

The device also allows to very easily apply a vibration to the membrane. Indeed, since the membrane and the piezoelectric beam are connected via the electrostatics forces, the application of an alternative voltage in addition to the direct voltage V1 to the piezoelectric actuator vibrates the latter, thus vibrating the beam and the membrane.

These vibrations can for example be generated in order to detach or sort biological cells without damaging the cell.

Moreover by using a transparent membrane, it is easy to characterise the level of detachment of the cells from the membrane via the rear face, by using an inverted microscope that is conventionally present in a laboratory.

The application of vibrations to the membrane is also of interest in the case of a haptic interface, indeed the application of vibrations is a very common haptic pattern for sending a vibrotactile signal to the user.

Figure 3A:
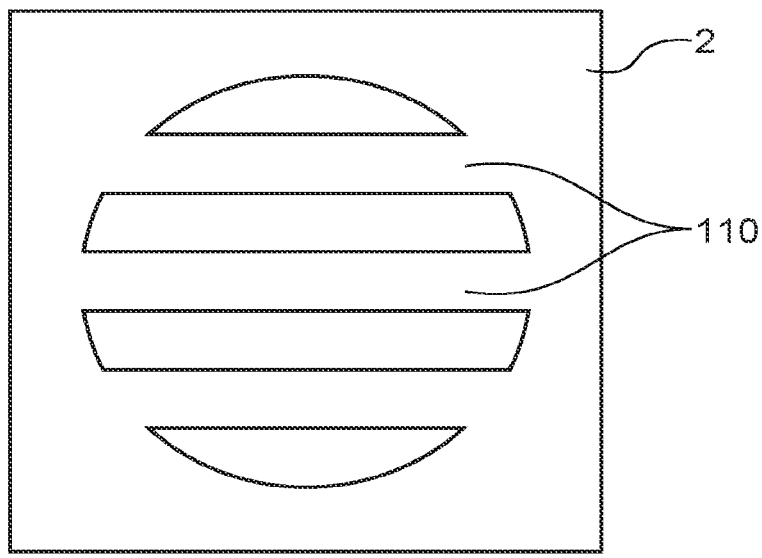
FIG. 3A is a top view of an alternative of realisation of the device according to the invention.

In FIG. 3A, variants of realisation of the device according to the invention comprising fixed beams in the place of cantilever beams can be seen.

In FIG. 3A, the beams 110 are parallel to each other.

Figure 3B:
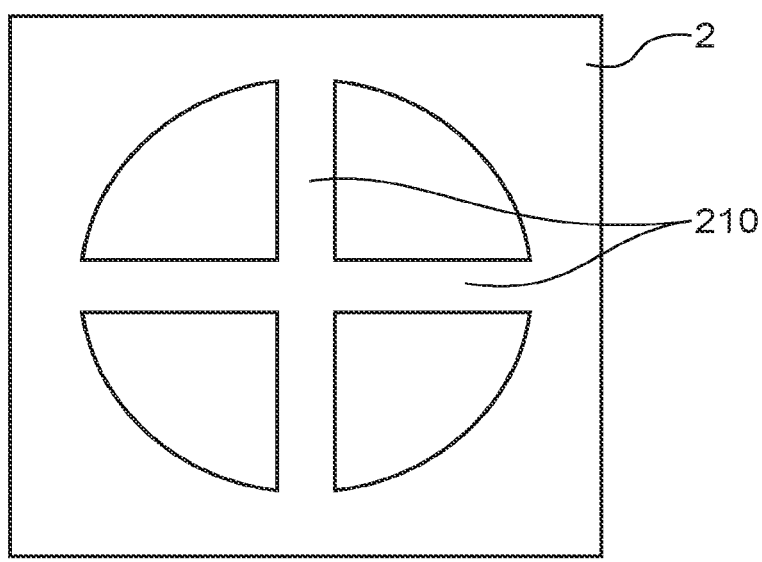
FIG. 3B is a top view of another alternative of realisation of the device according to the invention.

In FIG. 3B, the beams 210 intersect and are made from a single piece in order to form a cross.

Other configurations are possible, for example such as the implementation both of one or more fixed beams and of one or more cantilever beams. As a variant, a plate can be implemented.

Figure 5:
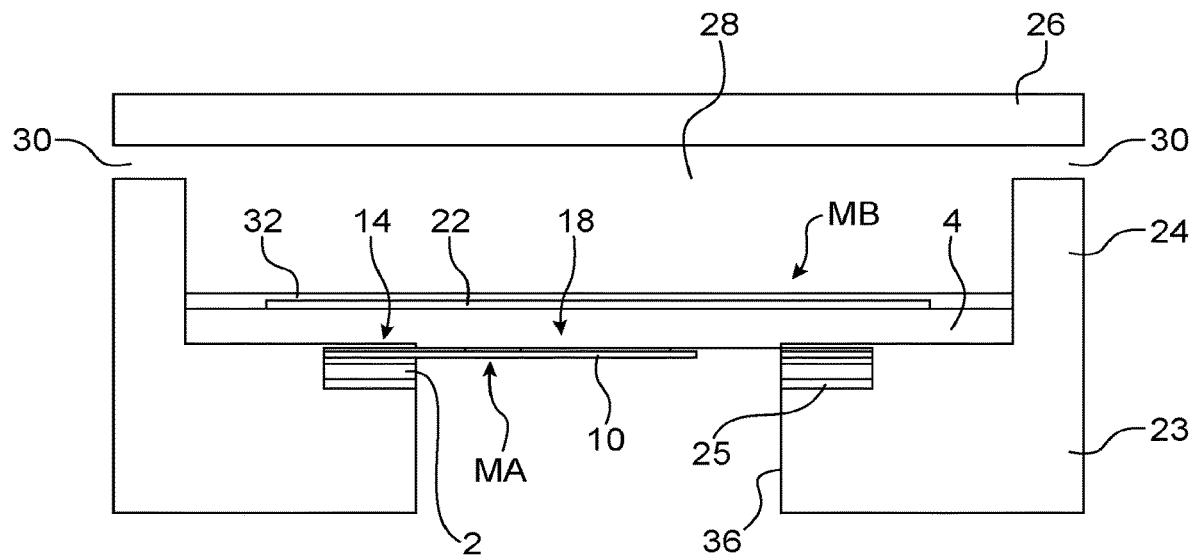
FIG. 5 is a cross-sectional view of an example of a microfluidic system implementing the device according to the invention.

In FIG. 5, an example of a microfluidic system S implementing the device with a membrane according to the invention and adapted for example to the treatment of biological cells can be seen.

The system S comprises a case 23 and a cover 26. The case 23 comprises a bottom provided with an opening 25. The opening 25 is bordered by a recess 27 receiving the actuation module MA; the membrane 4 is disposed on the bottom of the case 23 in such a way that the membrane is suspended above the opening 25. The case 23 comprises lateral walls 24 defining, with the cover 26, a fluidic cavity 28. One or more orifices 30 in the lateral walls allow the supply and the evacuation of a solution containing the biological cells to be treated.

Preferably the cover 26 is transparent. In this use, the membrane 4 and in particular the electrode 22 is covered by a layer 32, for example made of polymer, preferably in order to insulate the electrode from the fluid that will circulate in the cavity and come in contact with the membrane.

Figure 6:
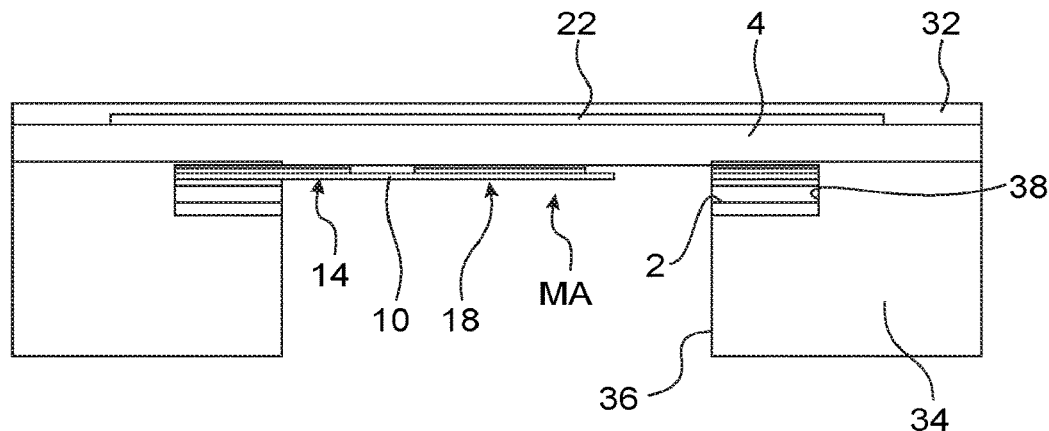
FIG. 6 is a cross-sectional view of an example of a haptic device implementing the device according to the invention.

In FIG. 6, an example of realisation of a haptic button can be seen. The button comprises a support 34 provided with an opening 36. The opening 36 is bordered by a recess 38 receiving the actuation module MA; the membrane 4 is disposed on the module MA and on the support in such a way that the membrane 4 is suspended above the opening 36. The user can for example pass the user's finger over the membrane and feel the haptic patterns recorded.

The support is for example made of injected polycarbonate or Plexiglas. For example when the haptic button is disposed on the dashboard of a motor vehicle or in a piece of electronic equipment or household electrical appliance, the support can be made by injection or 3D printing.

Like for the microfluidic system, the membrane 4 and in particular the electrode 22 is advantageously covered by a layer 32, for example made of polymer, preferably in order to insulate the electrode from the fluid that will circulate in the cavity and come in contact with the membrane.

For comparison, the deflection obtained via a device according to the invention and that obtained by a device in which the piezoelectric actuator is deposited directly on the membrane will be compared.

A device D according to FIG. 2 is considered, comprising a membrane 10 mm in diameter. For greater simplicity, the calculation will be carried out while only taking into account a single beam.

The beam has a length of 4.8 mm, a width of 1 mm and a thickness of 8 µm. It is made of silicon. The actuators 14 and 18 are made of AlN and have a thickness of 2 µm. The actuators measure 1.5 mm in length and 0.8 mm in width.

By applying an actuation voltage of 200V, the deflection observed is 1.092 µm. By using actuators made of PZT which has a piezoelectric coefficient multiplied by approximately 100 with respect to that of AlN, the deflection would also by multiplied by approximately 100. The piezoelectric coefficient of PZT is approximately −170 pm/V and that of AlN is approximately −1.6 pm/V.

The deflection of a membrane in the case in which the piezoelectric actuator is deposited directly on the polymer will now be calculated. As was explained above, the piezoelectric material that can be deposited on a polymer has a low piezoelectric coefficient, for example approximately 3 pm/V. The membrane is made of polycarbonate having a thickness of 175 µm and comprises a layer of PVDF-TrFE electroactive polymer of 2.4 µm. The diameter of the membrane is 10 mm, and the actuator has a diameter of 60% of that of the membrane or 6 mm. The membrane is embedded over its entire periphery.

A voltage of 200V is applied to the terminals of the piezoelectric materials, a displacement of 337 nm is observed.

It is noted that by using actuators made of AlN in a device according to the invention, the displacement can be multiplied at least by 3 and by at least 300 by using actuators made of PZT.

Also for comparison, the forces generated by a device according to the invention and a membrane on which the actuator is deposited will be estimated.

According to the following equations, the force returned (F) can be calculated.

$$F = k \cdot x \text{ with } k = f_0^2 \cdot (2\pi)^2 \cdot m$$

With k the rigidity of the system in question, $f_0$ its resonance frequency and m the mass of the membrane.

For a membrane made of polymer material on which the actuator is deposited, the force returned when it is actuated at 200V is 4.81 mN.

In the case of a device according to the invention comprising 8 beams as shown in FIG. 1, the estimated force feedback is 80.2 mN, or more than 16 times greater.

The use of the device according to the invention in order to create a force-feedback button is particularly advantageous since it allows to obtain forces offering satisfactory feel.

An example of a method for creating a device with a membrane according to the invention will now be described. This is advantageously a method implementing microelectronics techniques, which allows to create a device adapted to the size of cells. Other methods could be possible.

Figure 7A:
FIGS. 7A to 7S are diagrams of various steps of an example of a method of creation of the device according to the invention.
Figure 7B:
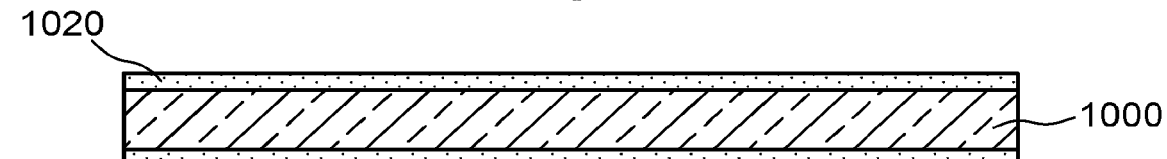
Figure 7C:
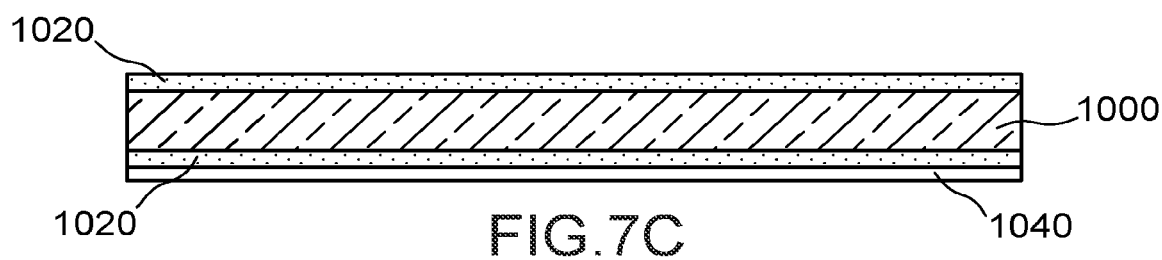
Figure 7D:
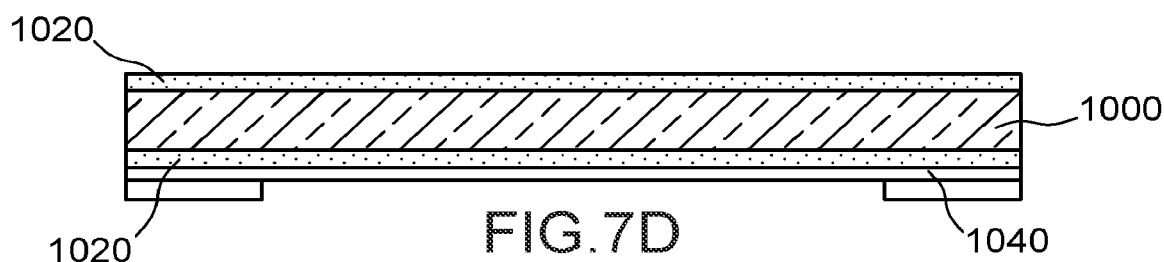
Figure 7E:
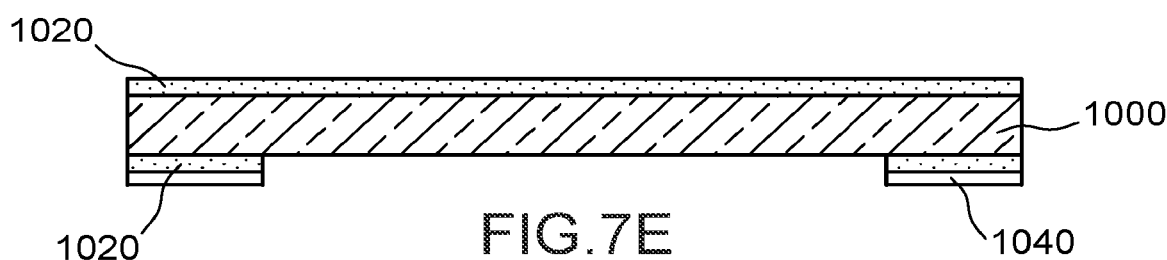
Figure 7F:
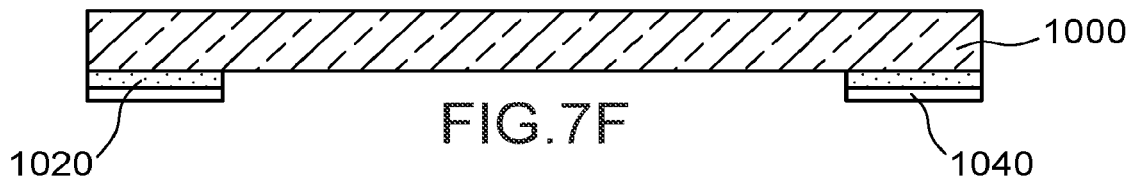
Figure 7G:
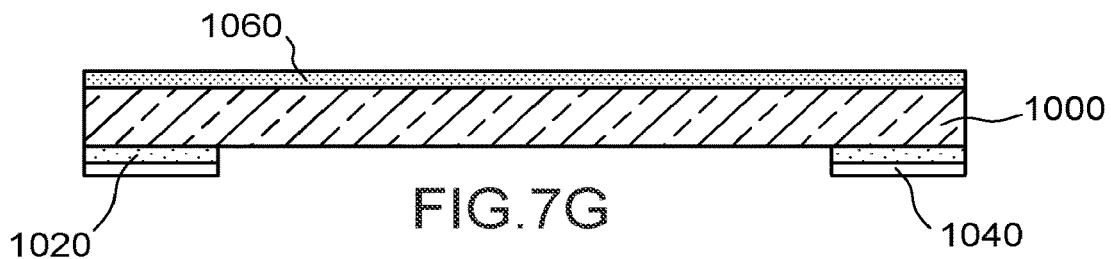
Figure 7H:
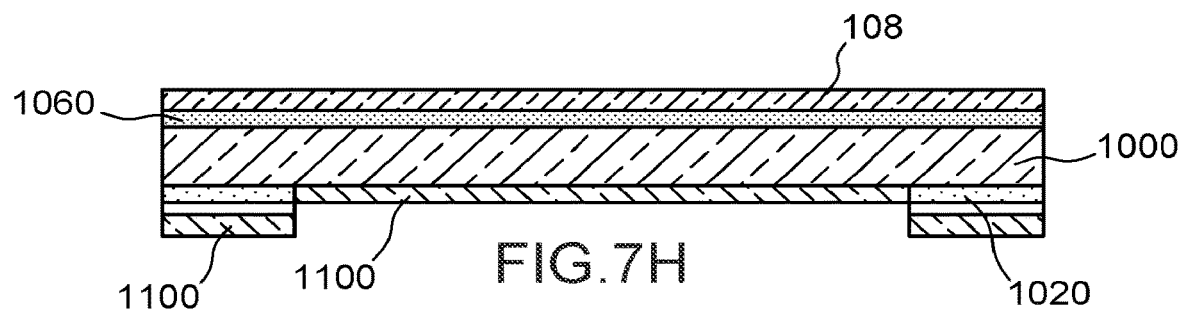
Figure 7I:
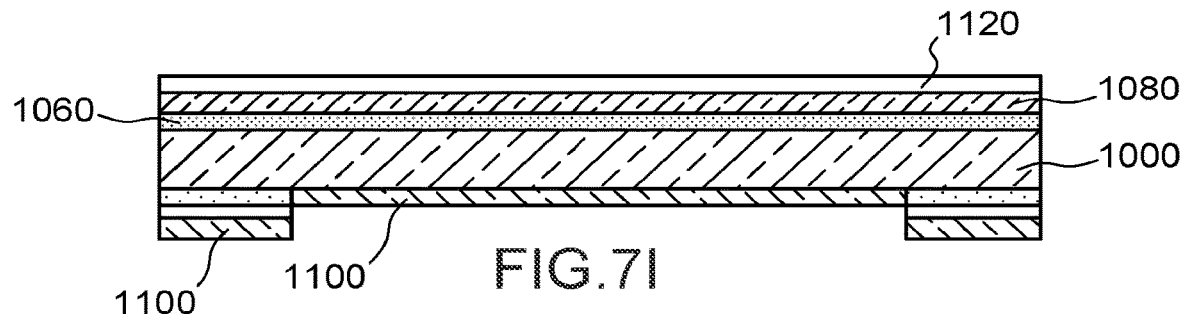
Figure 7J:
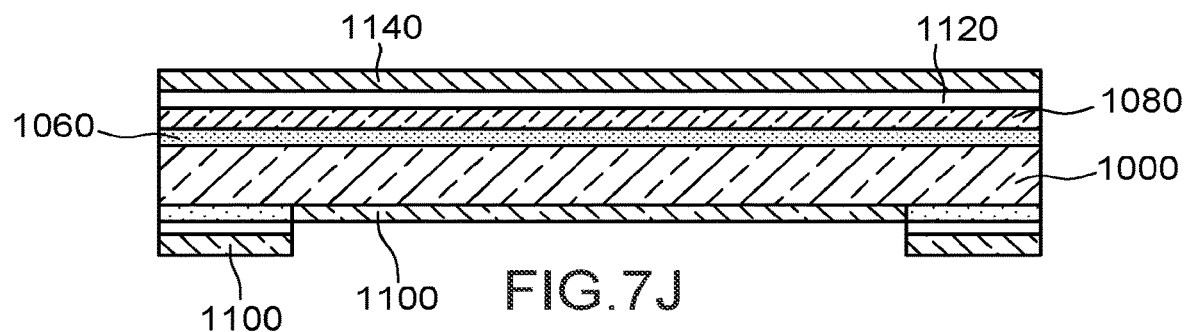
Figure 7K:
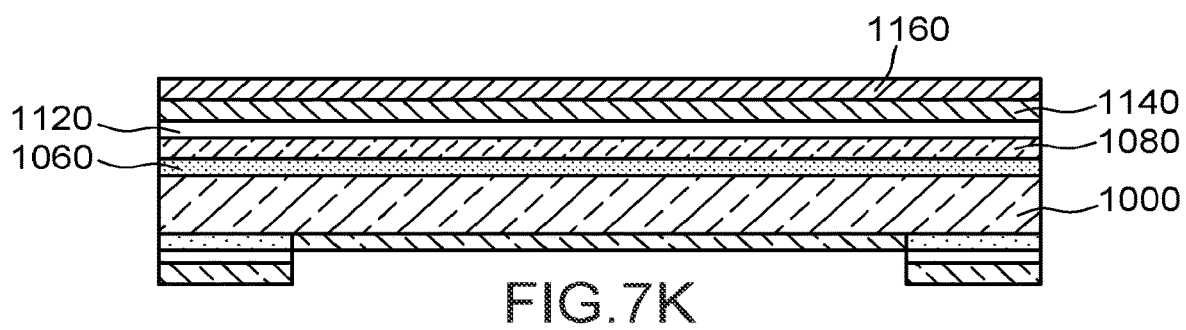
Figure 7L:
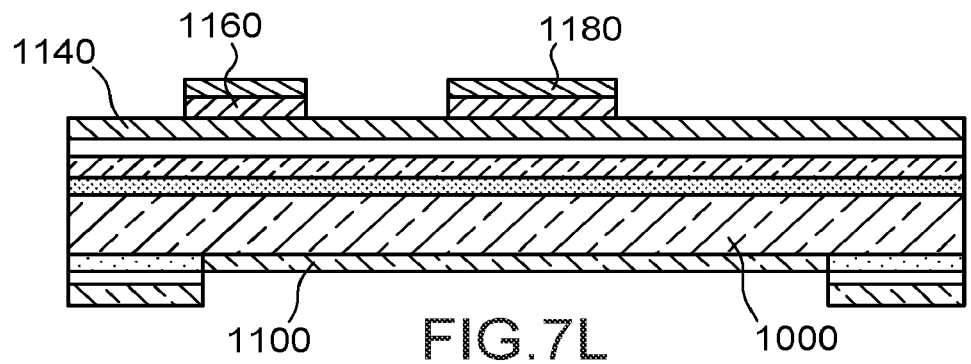
Figure 7M:
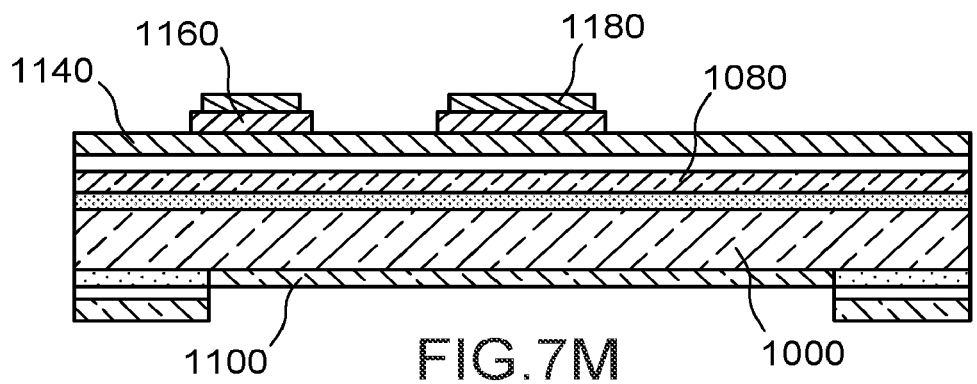
Figure 7N:
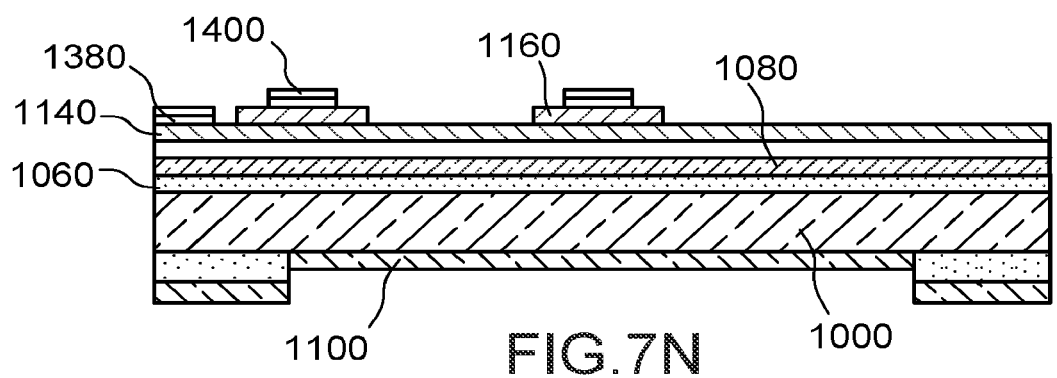
Figure 7O:
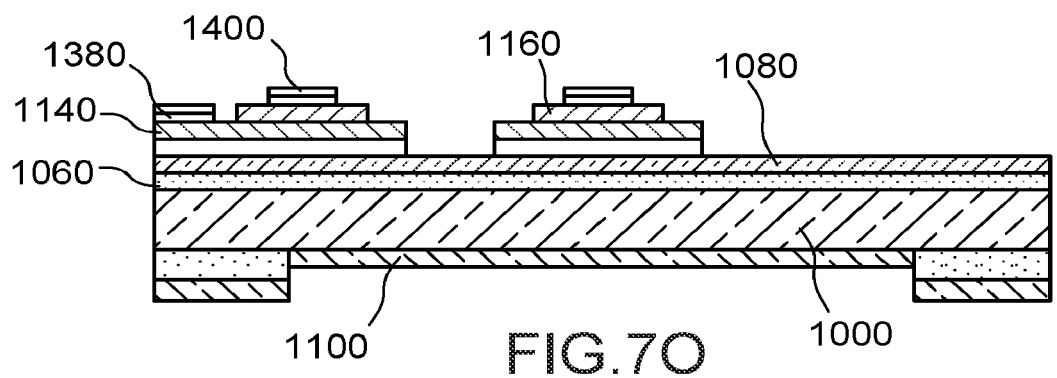
Figure 7P:
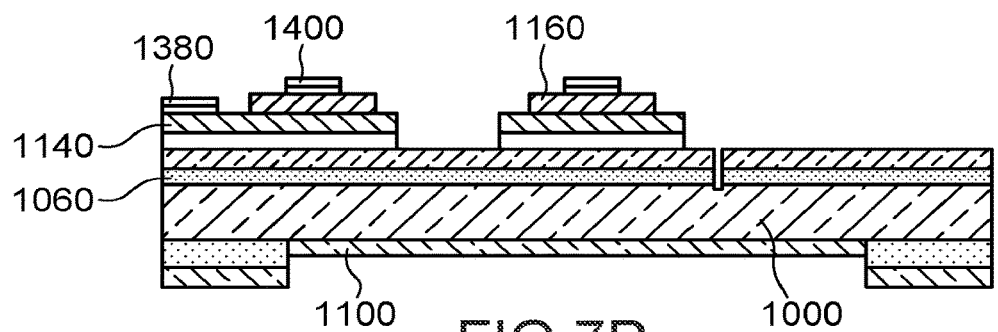
Figure 7Q:
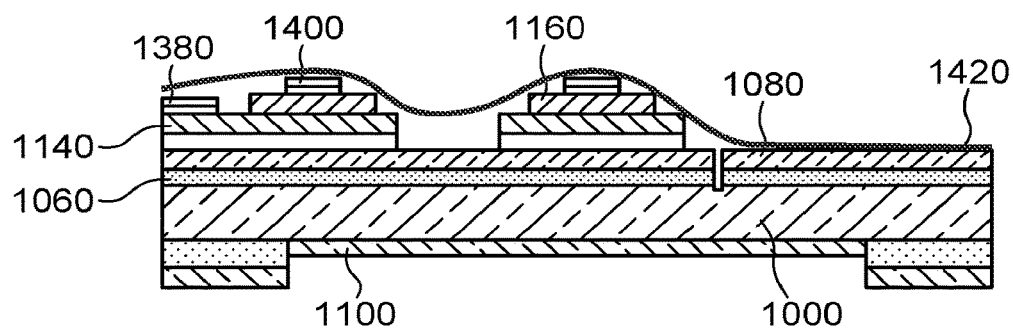
Figure 7R:
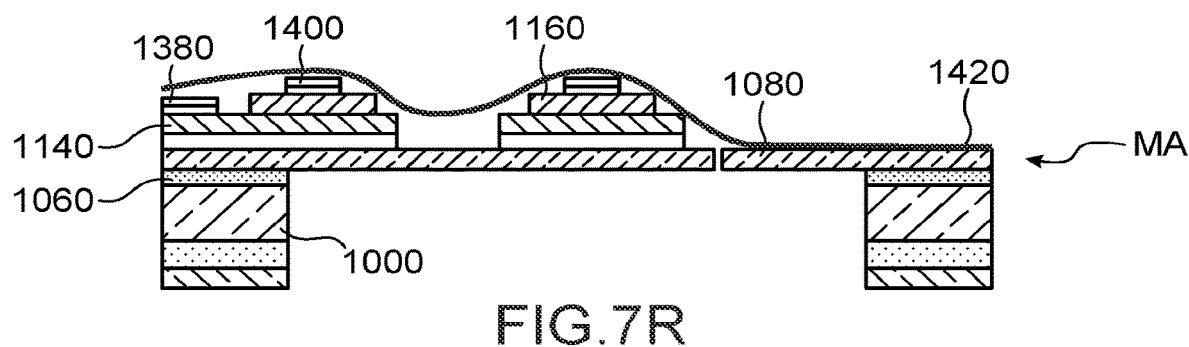
Figure 7S:
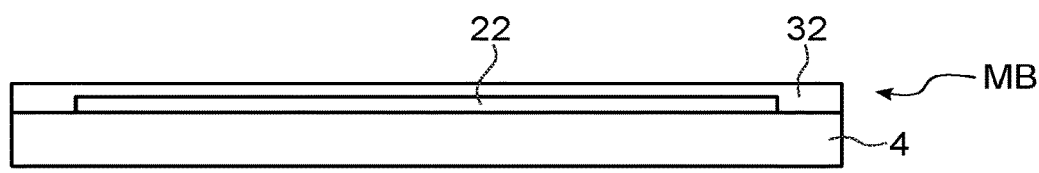

The steps are schematically shown in FIGS. 7A to 7S.

For example, a substrate made of silicon 1000 shown in FIG. 7A is used, having for example a thickness of 725 µm and a diameter of 200 mm in diameter. A substrate made of glass for example is possible.

During a first step, a thermal oxidation of the substrate is carried out in such a way as to form a layer of oxide 1020 on all the surfaces of the substrate having a thickness of 2µm for example. The element thus obtained is shown in FIG. 7B.

Then, a hard mask of oxide 1040 is made on the rear face of the substrate. This mask has for example a thickness of 7 µm. The mask is made by turning over the substrate; according to the deposition composition chosen; it is possible to only deposit the mask on this face. This can be for example a deposition of the PVD type (Physical Vapour Deposition in Anglo-Saxon terminology). The element thus obtained is shown in FIG. 7C.

Then a lithography is carried out on the hard mask. The element thus obtained is shown in FIG. 7D.

During a following step, the hard mask and the layer of oxide 1020 are etched, for example via reactive-ion etching (RIE: Reactive-Ion Etching in Anglo-Saxon terminology), on the rear face in such a way as to reach the rear face of the substrate 1000. The element thus obtained is shown in FIG. 7E.

During a following step, the layer of oxide on the front face is removed, for example via deoxidation or chemical etching. The element thus obtained is shown in FIG. 7F.

During a following step, a layer of oxide 1060 is formed on the front face. Advantageously, densification annealing takes place for example at a temperature of approximately 800° C. The element thus obtained is shown in FIG. 7G.

During a following step, a layer 1080 on the front face, intended to form the beam(s), and a layer 1100 on the rear face are formed. Preferably, these layers are for example made of polysilicon, of SiC or of SiO₂. The thickness of the layers 1080, 1100 is for example between several hundred nm to several µm, or even several tens of µm.

The layers 1080, 1100 are for example made via chemical vapour deposition (or CVD for Chemical Vapour Deposition in Anglo-Saxon terminology) or via epitaxial growth. Preferably, the stress on the layers 1080, 1100 are controlled.

The layers 1080, 1100 can be formed in several goes. For example, for a thickness of 4 µm, two layers 1.5 µm thick and a layer 1 µm thick are made successively.

Advantageously, a step of annealing then takes place. The element thus obtained is shown in FIG. 7H.

During a following step, a layer 1120 is formed on the layer 1080 for example from SiO₂ or from SiN, having for example a thickness between several hundred nm and several µm. The layer 1120 is formed for example by thermal oxidation or by CVD deposition. Advantageously, densification annealing takes place for example at a temperature of approximately 800° C.

The element thus obtained is shown in FIG. 7I.

During a following step, the first 14 and second 18 actuator are made.

For this, first a layer 1140 intended to form the lower electrodes of the actuators is made, for example from Pt or from Mo. The layer 1140 is made for example by deposition on the layer 1120. The layer 1140 has for example a thickness between several tens of nm to several hundred nm. The element thus obtained is shown in FIG. 7J.

A layer of piezoelectric or ferroelectric material 1160 is then formed on the layer 1140, for example from PZT, AlN, ZnO, LNO, the thickness of which is for example between several hundred nm to several μm.

Then, the upper electrode is made by formation of a layer 1180 on the piezoelectric or ferroelectric material 1160, for example from Ru or from Au for example having a thickness between several tens of nm to several hundred nm. The element thus obtained is shown in FIG. 7K.

Steps of etching then take place.

First of all, the layer 1180 is etched in such a way as to define at least one beam 10 and the actuators 14 and 18.

Then, the layer 1160 made of piezoelectric or ferroelectric material is etched.

The element thus obtained is shown in FIG. 7L.

Then, the remaining layer portions 1180 are again etched in such a way that they are set back with respect to the layer portions 1160. The element thus obtained is shown in FIG. 7M.

A layer 1380 for example made of Ruthenium and then a layer 1400 for example made of gold are formed. Etching is then carried out in such a way as to define ruthenium-gold contacts on the PZT material and on the edge of the layer 1140.

The element thus obtained is shown in FIG. 7N.

The layer 1140 is then etched, as well as the layer of oxide 1120.

Preferably, a staircase-shaped profile is made. The latter is obtained since all the layers are deposited then etched, starting from the upper layer, by using different photolithography masks, the second mask being wider than the first mask, etc. This allows to leave safety margins in order to avoid the covering of layers, which could appear because of the incertitude in positioning of the masks. Any electric short-circuit between the electrodes is thus avoided. The element thus obtained is shown in FIG. 7O.

During a following step, the layers 1080, 1060 and the layer 1000 over a portion of its thickness are etched in order to define the beams. The element thus obtained is shown in FIG. 7P.

During a following step, a dry film 1420 is deposited on the front face of the element of FIG. 7P. The dry film serves to protect the front face of the element during the deep etching that goes follow. The film is then advantageously preserved in order to form the flexible support onto which the cells will adhere. This support will be deformed by the activation of the actuators.

The element thus obtained is shown in FIG. 7Q.

During a following step, the rear face is etched in order to free the beams via deep etching. The substrate 1000 and the layer of oxide 1060 are etched until the beams are reached.

The element thus obtained is shown in FIG. 7R. Said element forms the actuation module MA.

Moreover the module MB is manufactured. The membrane is for example cut out from a flexible substrate made of polymer, for example made of PEN or PC, the thickness of which can be between several p.m and several hundred μm, see several mm.

During a following step, the electrode 22 is made on the membrane for example by means of a screen-printing mask in such a way as to carry out a localised deposition of the electrode 22.

During a following step, a passivation layer can be advantageously deposited on the electrode 22. The layer is for example made of polymer. The passivation layer can for example be made via centrifugation (spin coating in Anglo-Saxon terminology).

The membrane provided with the electrode 22 and the passivation layer is shown in FIG. 7S.

During a following step, the module MB and the actuation module MA are assembled.

As was described in in relation to FIGS. 5 and 6, they can be assembled via a case of a microfluidic device or a support of a haptic button.

The distance between the upper face of the actuation module and the lower face of the membrane is controlled in order to precisely control the deformation of the membrane, and this distance is preferably minimised, it is for example at most equal to 1 μm in order to maximise the effect of the displacement of the beams on the deformation of the membrane. The distance is controlled by assembly of the module NB and of the actuation module MA.

The actuation module is for example glued into the case and the membrane is glued onto the bottom of the case above the module MA.

It is possible for the face of the membrane to be in contact with the module MA

In the case of a haptic button, the support can be made via injection or 3D printing and the actuation module is for example glued into the support and the membrane is glued onto the support above the module MA. It is possible for the face of the membrane to be in contact with the module MA The device according to the invention is particularly adapted to the field of treatment of biological cells. It is also adapted to the creation of haptic interfaces, for example for the automobile field.

The invention claimed is:

1. A device with a membrane comprising:
   a support;
   a membrane at least partly made of a polymer material, suspended from said support;
   at least one actuation module disposed facing a face of the membrane and distinct from said membrane, said actuation module including at least one first actuator having at least one first material capable of expanding and/or contracting under the effect of an outside stimulus secured to an element anchored to the support and distinct from the membrane, in such a way that, when an outside stimulus is applied to the first material, a bimetallic-strip effect appears between the first material and the element, deforming the element in a direction of the membrane and causing the deformation of the membrane; and
   at least one electrostatic actuator configured to press at least a portion of the membrane against at least a portion of the actuation module.

2. The device with a membrane according to claim 1, wherein said element comprises a cantilever beam.

3. The device with a membrane according to claim 1, comprising a plurality of elements anchored to the support.

4. The device with a membrane according to claim 2, comprising a plurality of elements anchored to the support, wherein the cantilever beams are disposed radially and wherein each beam comprises a free end, the free ends of the beams being located at a central portion of the membrane.

5. The device with a membrane according to claim 1, wherein the actuation module further comprises, at least a second actuator comprising a second material capable of expanding and/or contracting under the effect of an outside stimulus, said second actuator being rigidly connected to said element.

6. The device with a membrane according to claim 5, wherein said second material is disposed with respect to the first material in such a way as to be capable of applying, to said element, a deformation having a curvature opposite to that applied by the first material.

7. The device with a membrane according to claim 1, wherein the at least one electrostatic actuator comprises at least one electrode carried by the membrane and at least one electrode rigidly connected to said element.

8. The device with a membrane according to claim 5, wherein the first and/or the second material is a piezoelectric or ferroelectric material, the first and/or the second actuator comprising electrodes for applying a difference in electric potential to the first and/or second material.

9. The device with a membrane according to claim 8, wherein the first material and/or the second material are chosen from AlN, PZT, ZNO, LNO.

10. The device with a membrane according to claim 5, wherein the first actuator and/or the second actuator is or are thermal actuators.

11. The device with a membrane according to claim 5, wherein the first and/or the second material is a piezoelectric or ferroelectric material, the first and/or the second actuator includes electrodes for applying a difference in electric potential to the first and/or second material, and
wherein at least one of the electrodes of the first and/or of the second actuator is an electrode secured to the element.

12. The device with a membrane according to claim 5, comprising a vibrator for vibrating the membrane.

13. The device with a membrane according to claim 12, wherein the vibrator comprises the first and/or the second actuator.

14. The device with a membrane according to claim 1, wherein the polymer material of the membrane is a transparent polymer.

15. A device for treatment of biological cells comprising at least one device with a membrane according to claim 1.

16. A haptic interface comprising at least one device with a membrane according to claim 1.

17. A method for creating a device with a membrane according to claim 1, comprising the steps:
creation of an actuation module,
creation of a membrane entirely or portion made of a polymer material,
assembly of the actuation module and of the membrane in such a way that the activation of the actuation module deforms the membrane.

* * * * *